(12) United States Patent
Doyle et al.

(10) Patent No.: US 11,393,874 B2
(45) Date of Patent: Jul. 19, 2022

(54) INDEPENDENTLY SCALING SELECTOR AND MEMORY IN MEMORY CELL

(71) Applicant: Intel Corporation, Santa Clara, CA (US)

(72) Inventors: Brian S. Doyle, Portland, OR (US); Abhishek A. Sharma, Hillsboro, OR (US); Ravi Pillarisetty, Portland, OR (US); Elijah V. Karpov, Portland, OR (US); Prashant Majhi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 210 days.

(21) Appl. No.: 16/635,948

(22) PCT Filed: Sep. 29, 2017

(86) PCT No.: PCT/US2017/054281
§ 371 (c)(1),
(2) Date: Jan. 31, 2020

(87) PCT Pub. No.: WO2019/066894
PCT Pub. Date: Apr. 4, 2019

(65) Prior Publication Data
US 2020/0321395 A1    Oct. 8, 2020

(51) Int. Cl.
*H01L 27/24* (2006.01)
*H01L 27/22* (2006.01)
(Continued)

(52) U.S. Cl.
CPC ........ *H01L 27/2409* (2013.01); *H01L 27/224* (2013.01); *H01L 43/12* (2013.01); *H01L 45/1675* (2013.01)

(58) Field of Classification Search
CPC .................................................. H01L 27/2049
See application file for complete search history.

(56) References Cited

U.S. PATENT DOCUMENTS

2006/0073655 A1    4/2006   Dennison
2009/0020745 A1*   1/2009   Jeong .................... H01L 27/24
                                                              257/4
(Continued)

FOREIGN PATENT DOCUMENTS

WO    WO-2019-022732    1/2019

OTHER PUBLICATIONS

International Preliminary Report on Patentability for International Patent Application No. PCT/US2017/054281 dated Apr. 9, 2020, 11 pgs.
(Continued)

*Primary Examiner* — Mounir S Amer
(74) *Attorney, Agent, or Firm* — Schwabe, Williamson & Wyatt, P.C.

(57) ABSTRACT

Embedded non-volatile memory structures having an independently sized selector element and memory element are described. In an example, a memory device includes a metal layer. A selector element is above the metal layer. A memory element is above the metal line. A spacer surrounds one of the selector element and the memory element having a smallest width, and wherein the one of the selector element and the memory element not surrounded by the spacer has a width substantially identical to the spacer and is in alignment with the spacer.

23 Claims, 10 Drawing Sheets

(51) Int. Cl.
*H01L 43/12* (2006.01)
*H01L 45/00* (2006.01)

(56) References Cited

U.S. PATENT DOCUMENTS

| | | |
|---|---|---|
| 2011/0193042 A1 | 8/2011 | Maxwell |
| 2013/0140515 A1 | 6/2013 | Kawashima et al. |
| 2014/0158975 A1 | 6/2014 | Herner |
| 2016/0005963 A1 | 1/2016 | Kim |

OTHER PUBLICATIONS

International Search Report and Written Opinion for International Patent Application No. PCT/US2017/054281 dated Aug. 14, 2018, 14 pgs.

\* cited by examiner

INDEPENDENTLY SCALING SELECTOR AND MEMORY IN MEMORY CELL

CROSS-REFERENCE TO RELATED APPLICATION

This patent application is a U.S. National Phase Application under 35 U.S.C. § 371 of International Application No. PCT/US2017/054281, filed Sep. 29, 2017, entitled "INDEPENDENTLY SCALING SELECTOR AND MEMORY IN MEMORY CELL," which designates the United States of America, the entire disclosure of which is hereby incorporated by reference in its entirety and for all purposes.

TECHNICAL FIELD

Embodiments of the disclosure are in the field of integrated circuit structures and, in particular, independently scaled selectors and memory elements in a memory cell.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Embedded memory with non-volatile memory devices, e.g., on-chip embedded memory with non-volatility can enable energy and computational efficiency. A non-volatile memory device such as magnetic tunnel junction (MTJ) memory device or resistive random access memory (RRAM) device is coupled with selector element to form a memory cell. A large collection of memory cells forms a key component of non-volatile embedded memory. However, with scaling of memory devices, the technical challenges of assembling a vast number of memory cells presents formidable roadblocks to commercialization of this technology today.

BRIEF DESCRIPTION OF THE DRAWINGS

FIG. 5A illustrates a wordline formed in an opening in a dielectric layer formed above a substrate.

FIG. 5B illustrates the structure of FIG. 5A following the formation of a memory material layer stack, a conductive electrode layer and a selector material layer stack.

FIG. 5C illustrates the structure of FIG. 5B following a single lithography step that forms a photoresist mask on an uppermost surface of the selector material layer stack.

FIG. 5D illustrates the structure of FIG. 5C following the patterning of the selector material layer stack in alignment with the photoresist mask.

FIG. 5E illustrates the structure of FIG. 5D following the formation of a conformal film 518 on the conductive electrode layer.

FIG. 5F illustrates the structure of FIG. 5E following the patterning of the conformal film to a required size of the memory element via an etch process down to the conductive electrode layer to form a spacer.

FIG. 5G illustrates the structure of FIG. 5F following the etching of the conductive electrode layer and the memory material layer to form a memory element and a conductive electrode in alignment with the spacer.

DESCRIPTION OF THE EMBODIMENTS

Figure 1A:
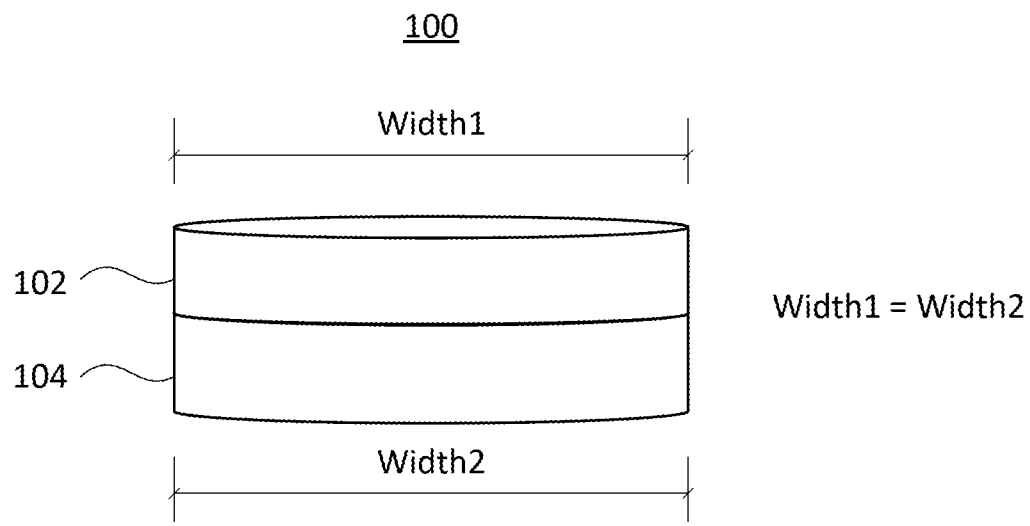
FIG. 1A illustrates a view of a 1 selector-1 resistor (1S-1R) memory cell.

A method and system of independently scaling selector and memory in memory cell are described. In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to hetero-structure material stacks for use as a selector for a non-volatile memory device. Embodiments may pertain to or include three-dimensional (3D) cross-point arrays, embedded non-volatile memory (eNVM), and selectors for eNVM. Approaches described herein may be implemented to realize high performance highly scaled eNVM cells, and potentially increase monolithic integration of eNVM in system-on-chips (SoCs) of future technology nodes.

To provide context, non-volatile memory devices such as a magnetic tunnel junction (MTJ) memory device or a resistive random access memory (RRAM) device depend on a phenomenon of resistance switching to store information. The non-volatile memory device functions as a variable resistor where the resistance of the device may switch between a high resistance state and a low resistance state. A non-volatile memory device may be coupled with a selector element to form a memory cell. The selector may be a volatile switching element that is placed in series with the non-volatile memory device. A large collection of such memory cells forms a key component of non-volatile embedded memory.

For example, in an embodiment a conductive electrode may be disposed between the selector element and a memory element. The memory cell may further include a bitline disposed above the selector element. In an embodiment, a large collection of memory cells each including a selector element and a memory element are utilized to form a non-volatile memory array. The non-volatile memory array formed by a memory cell at each intersection of a wordline and a bitline is, herein, referred to as a non-volatile cross-point memory array. A non-volatile cross-point memory array can offer significant advantages for scaling to achieve high density memory.

As a first example of a conventional selector stack, FIG. 1A illustrates a view of a 1 selector-1 resistor (1S-1R) memory cell. Referring to FIG. 1A, the memory cell 100 is shown comprising a selector element 102 disposed on a memory element 104. Typically, the memory cell 100 is fabricated by depositing memory material followed by depositing selector material, and then etching them both. In this case, the resulting selector element 102 and memory element 104 have identical widths (width 1=width 2). Problems are encountered, however, when the selector element 102 and the memory element 104 need to be different sizes. This could arise when the memory element 104 needs to be larger or smaller than the selector element 102, or the selector 102 needs to be smaller than a regular-sized memory element 104.

One way to create a selector element 102 and a memory element 104 with different sizes using a state-of-the-art fabrication process requires a first lithography step to deposit the memory material and pattern the memory material to a certain size to form the memory element 104. A dielectric material (not shown) may be optionally deposited on top of the memory element 104 and polished flat to the top of the memory material 104. A second lithography step would then be used to deposit the selector material and to pattern the selector material to define the selector element 102 independently of the memory element 104 to achieve two different widths for the selector element 102 and the memory element 104. This process, however, is inefficient in that it requires two lithography patterning steps, and the process may also lead to misalignment between the selector element 102 and the memory element 104.

Figure 1B:
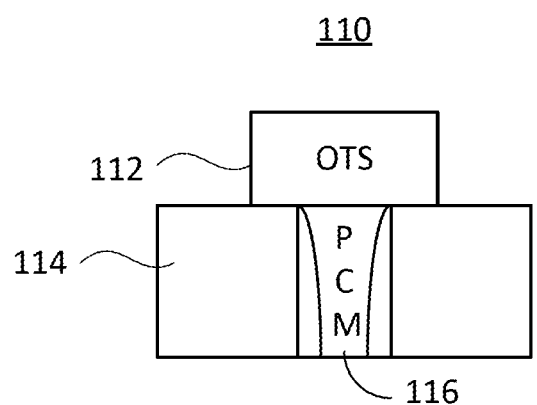
FIG. 1B illustrates a cross-sectional view of a selector stack in a phase change memory cell.

As a second example of a state-of-the-art selector stack, FIG. 1B illustrates a cross-sectional view of a selector stack in a phase change memory cell. The memory cell 110 is shown comprising a selector element 112, such as an ovonic threshold switch (OTS), disposed on a phase change memory (PCM) element 114. In this type of selector stack, a requirement that the selector element 112 be made smaller than the memory element 114 is not possible because selector material cannot be deposited over a via 116 in which the phase change memory element 114 is formed.

Figure 2A:
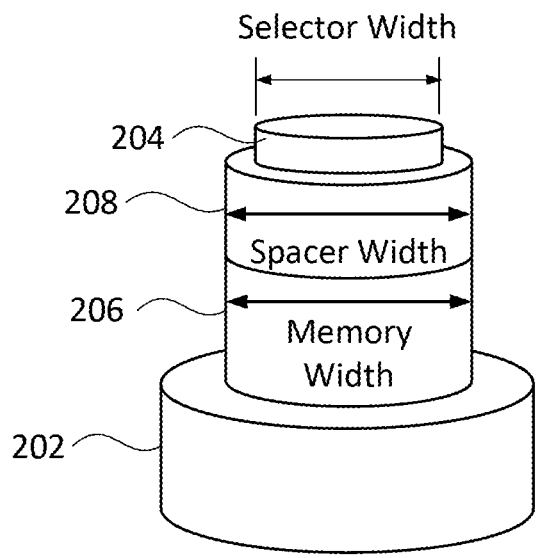
FIGS. 2A and 2B illustrates a memory cell disposed above a substrate comprising a selector element independently sized from a memory element in a single lithography patterning step through the use of a spacer.
Figure 2B:
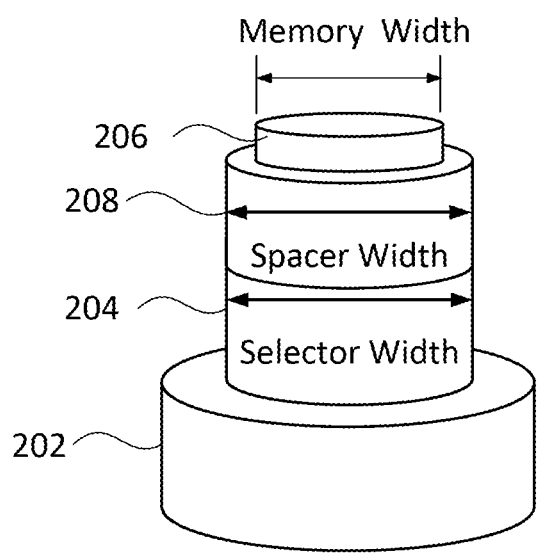

In accordance with the embodiments disclosed herein, a method is provided by which different widths may be obtained for a selector element and a memory element in a single lithography pattering step. FIGS. 2A and 2Ba are diagrams of a memory cell 200A, 200B fabricated in accordance with the disclosed embodiments.

Referring to FIGS. 2A and 2B, the memory cell 200A, 200B is disposed above a substrate 202 and comprises a selector element 204 independently sized from the memory element 206 in a single lithography patterning step through the use of a spacer 208. FIG. 2A shows an embodiment where the selector element 204 is smaller width-wise than the memory element 206, while FIG. 2B shows an embodiment where the memory element 206 is smaller width-wise than the selector element 204. In both embodiments, the substrate 202 may include a metal layer (not shown) disposed thereon.

In the embodiment shown in FIG. 2A, the selector element 202 is located above the metal layer, the spacer 208 surrounds the selector element 204, and the spacer width is larger than the selector element width. In this embodiment, the memory element 206 is located below both the selector element 204 and the spacer 208. Due to the presence of the spacer 208, the memory element 206 is in alignment with both the selector element 204 and the spacer 208 and has a width substantially identical to the spacer width.

In the embodiment shown in FIG. 2B, the memory cell 200' comprises a memory element 206 located above the metal layer, the spacer 208 surrounds the memory element 206 and the spacer width is larger than the memory element width. In this embodiment, the selector element 204 is located below both the memory element 206 and the spacer 208. Due to the presence of the spacer 208, the selector element 204 is in alignment with both the memory element 206 and the spacer 208 and has a width substantially identical to the spacer width. Accordingly, the embodiments shown in FIGS. 2A and 2B provide for a memory cell 200A, 200B, respectively, comprising a selector element 204 and a memory element 206 in alignment where one can be sized smaller than the other and where the smallest element is located above the larger element. In further detail. The memory cell 200A, 200B comprises a selector element 204 and a memory element 206 above a metal layer. A spacer 208 surrounds whichever one of the selector element 204 and the memory element 206 has the smallest width. Whichever element 204 206 not surrounded by the spacer 208 has a width substantially identical to the spacer 208 and is also in alignment with the spacer 208.

Described in other terms, the embodiments shown in FIGS. 2A and 2B provide for a memory cell 200A, 200B having a top element comprising a selector element 204 or a memory element 206, where the top element has a top element width and a top element thickness. A spacer 208 surrounds the top element and the spacer 208 has a spacer width larger than the top element width and a thickness less than the top element. A bottom element below the spacer 208 and the top element comprises the selector element 204 or the memory element 206 not present in the top element, where the bottom element is in alignment with both the top element and the spacer 208 and has a bottom element width substantially identical to the spacer 208.

Figure 3A:
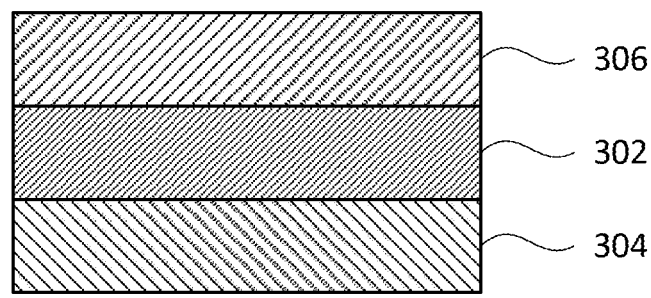
FIG. 3A illustrates a cross-sectional view of a monolayer selector element.
Figure 3B:
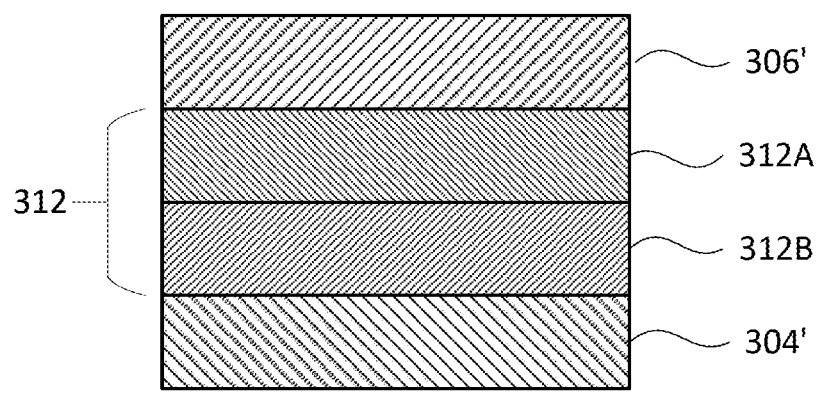
FIG. 3B illustrates a cross-sectional view of a bilayer selector element.

In one embodiment, the selector element may comprise a monolayer selector element, a bilayer selector element, or a tri-layer selector element. FIGS. 3A and 3B are diagrams illustrating a monolayer selector element and a bilayer selector element, respectively.

FIG. 3A illustrates a cross-sectional view of a monolayer selector element including a material having a field-induced insulator metal transition. The selector element 300 includes an insulator metal transition (IMT) material layer 302 between a bottom electrode 304 and a top electrode 306. In another embodiment, the monolayer selector element may include a semiconducting oxide material layer (not shown) in place of the (IMT) layer.

FIG. 3B illustrates a cross-sectional view of a bilayer selector element. The bilayer selector element 310 includes a bilayer 312 comprising a first material layer 312A and a second material layer 312B. The bilayer selector element 312 is between a bottom electrode 304' and a top electrode 306'. One of the first or second material layers 312A or 312B may comprise PN junction (P-i-N) diodes, in silicon or germanium, oxide-based diodes such as HfO2, Al2O3, TiO2, Ta2O5, and the like sandwiched between metals (e.g. TiN/Ta2O5/TiN, Ni/TiO2/Ni, Pt/IZO/CoO/Pt/TiN or Pt/HfO2/ZrO2/TiN), silver-doped or copper-doped oxide such as SiO2 or HfO2 & ZrO2, vanadium (V) oxide, Ovonic threshold switching (OTS) or multicomponent chalcogenides, or a niobium oxide (NbxOy) in one embodiment. In one embodiment, the other of the first or second material layers 312A or 312B may comprise an IMT material or a semiconducting material layer.

Figure 4A:
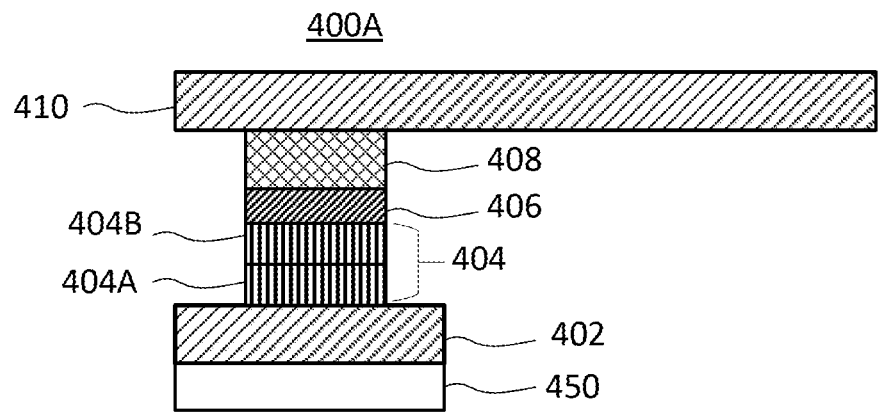
FIG. 4A illustrates a cross-sectional illustration of a memory cell disposed above a substrate.
Figure 4B:
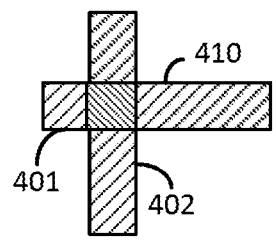
FIG. 4B illustrates a plan view of the memory cell of FIG. 4A.
Figure 4C:
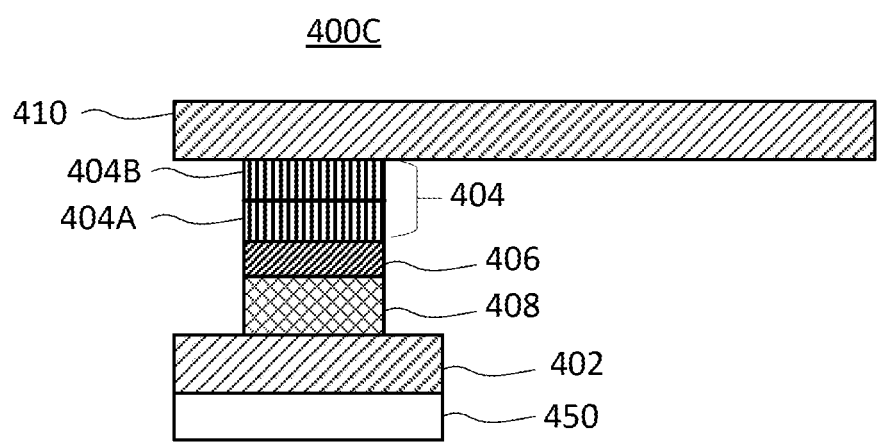
FIG. 4C illustrates a cross-sectional illustration of a memory cell, in accordance with an embodiment of the present disclosure.

In an exemplary implementation, FIGS. 4A-4C illustrates a cross-sectional illustration of a memory cell 400 disposed above a substrate 450 in further detail. Referring to FIG. 4A, the memory cell 400A includes a wordline 402 disposed above the substrate. In this embodiment, a bilayer selector element 404 is shown disposed above the wordline. In other embodiments, a monolayer or tri-layer selector element could be used. In an embodiment, a conductive electrode 406 is disposed on the bilayer selector element 404. In an embodiment, a bipolar memory element 408 is disposed above the conductive electrode 406, and a bit line 410 is disposed above the bipolar memory element 408.

In an embodiment, the memory device 408 includes a magnetic tunnel junction (MTJ) memory device. In an embodiment, the memory device 408 includes a resistive random access memory (RRAM) device. In an embodiment, the memory device 408 includes a phase change memory (PCM) device.

In an embodiment, the bilayer selector element includes first 402A and second 402B material layers. One of the first 402A and second 402B material layers may be a ferroelectric oxide material layer. The other of the first 402A and second 402B material layers is an insulator metal transition material layer or a semiconducting oxide layer.

In an embodiment, the insulator metal transition material layer is selected from the group consisting of a vanadium oxide material and a niobium oxide material. In an embodiment, the insulator metal transition material layer is a single crystalline material. In another embodiment, the insulator metal transition material layer is an amorphous or a polycrystalline material. In an embodiment, the semiconducting oxide material layer is one such as, but not limited to, indium gallium zirconium oxide (IGZO), tin oxide, antimony oxide, indium oxide, indium tin oxide, titanium oxide, zinc oxide, indium zinc oxide, gallium oxide, titanium oxynitride, ruthenium oxide, or tungsten oxide.

In an embodiment, the conductive electrode 406 is disposed on the bilayer selector element 404. In an embodiment, the conductive electrode 406 includes a material selected from the group consisting of WN, TiN, TaN, W, Ti, Ta and Ru. In an embodiment, the conductive electrode 406 has a thickness between 5 nanometers and 10 nanometers.

FIG. 4B illustrates a plan view of the memory cell 400. In an embodiment, the wordline 402 and the bit line 410 are arranged in an orthogonal manner. An outline 401 of the bilayer selector element 404, conductive electrode 406 and bipolar memory element 408, relative to the bitline 410 and the wordline 402 is also illustrated in FIG. 4B. In an embodiment, the bilayer selector element 404, the conductive electrode 406 and the bipolar memory element 408 are spatially confined to an intersection between the wordline 402 and the bitline 408, which may be referred to as a cross point memory cell.

FIG. 4C illustrates a cross-sectional illustration of a memory cell 400C where the bipolar memory element 408 is disposed on the wordline 402, a conductive electrode 406 is disposed on the bipolar memory element 408 and a bilayer selector element 404 is disposed above the conductive electrode 406.

FIGS. 5A-5G illustrate cross-sectional views representing various operations in a method of fabricating a memory cell in accordance with the embodiments disclosed herein.

Figure 5A:
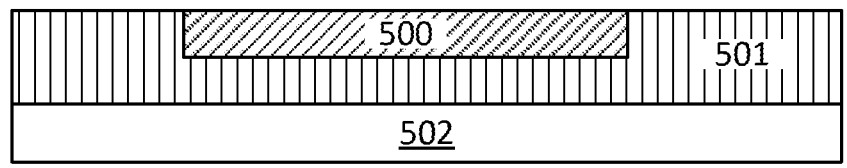
FIGS. 5A-5G illustrate cross-sectional views representing various operations in a method of fabricating a memory cell, where.

FIG. 5A illustrates a wordline 500 formed in an opening in a dielectric layer 501 formed above a substrate 502.

In an embodiment, the substrate 502 includes a suitable semiconductor material such as but not limited to, single crystal silicon, polycrystalline silicon and silicon on insulator (SOI). In another embodiment, substrate 502 includes other semiconductor materials such as germanium, silicon germanium or a suitable group III-N or a group III-V compound.

In an embodiment, the wordline 500 is formed in a dielectric layer 501 by a damascene or a dual damascene process that is well known in the art. In an embodiment, the wordline 500 includes a barrier layer, such as titanium nitride, ruthenium, tantalum, tantalum nitride, and a fill metal, such as copper, tungsten. In another embodiment, the wordline 500 includes a layer of a single material such as TiN or TaN. In an embodiment, the wordline 500 is fabricated using a subtractive etch process when materials other than copper are utilized. In one such embodiment, the wordline 500 includes a material such as but not limited to titanium nitride, ruthenium, tantalum, tantalum nitride. In an embodiment, the dielectric layer 501 includes a material such as but not limited to silicon dioxide, silicon nitride, silicon carbide, or carbon doped silicon oxide. In an embodiment, the dielectric layer 501 has an uppermost surface substantially co-planar with an uppermost surface of the wordline 500. In an embodiment, the dielectric layer 501 has a total thickness between 70 nm-300 nm. In an embodiment, wordline 500 is electrically connected to a circuit element such as an access transistor (not shown). Logic devices such as access transistors may be integrated with memory devices such as a MTJ device to form embedded memory.

Figure 5B:
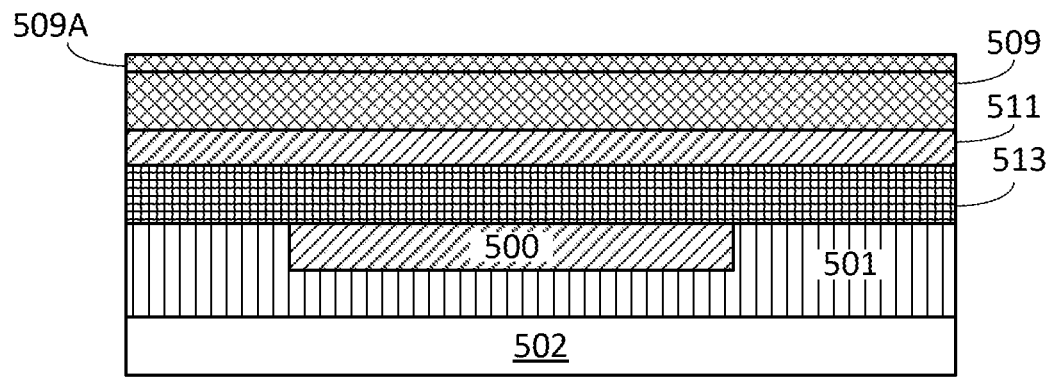

FIG. 5B illustrates the structure of FIG. 5A following the formation of a memory material layer stack 513 on the wordline 500, formation of a conductive electrode layer 511 on memory material layer stack 513, and formation of a selector material stack 509 on the conductive electrode layer 511.

In an embodiment, the memory material layer stack 513 is blanket deposited on the wordline 500 and on the dielectric layer 501 using a PVD process. In an embodiment, when the memory material layer stack 513 includes layers for an MTJ memory element the memory material layer stack 513 is subjected to an annealing process performed at a temperature between 300-400 degrees Celsius.

In an embodiment, the conductive electrode layer 511 is blanket deposited by a PVD process. In an embodiment, the conductive electrode layer 511 is deposited to a thickness between 5 nm-10 nm.

In an embodiment, the selector material stack 509 is blanket deposited on the conductive electrode layer 511 by an evaporation process, an atomic layer deposition (ALD) process or by chemical vapor deposition (CVD) process. In an embodiment, the chemical vapor deposition process is enhanced by plasma techniques such as RF glow discharge (plasma enhanced CVD) to increase the density and uniformity of the film. In an embodiment, an uppermost layer of selector material layer stack 509A may include an uppermost electrode layer that ultimately acts as a hardmask. In an embodiment, the uppermost electrode layer has a thickness between 70 nm-100 nm.

Figure 5C:
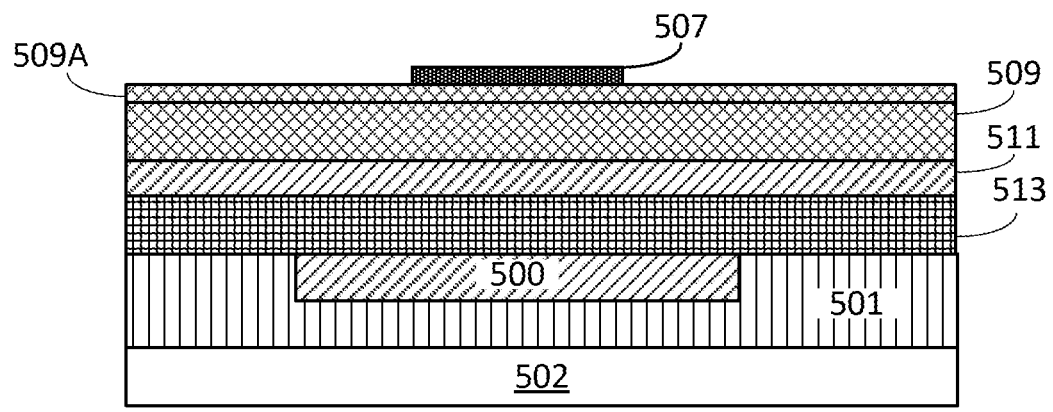

FIG. 5C illustrates the structure of FIG. 5B following a single lithography step that forms a photoresist mask 507 on an uppermost surface of the selector material layer stack 509. In an embodiment, the photoresist mask 507 is formed at a minimum size required for either the selector element or the memory element, and defines a location where a memory cell will be subsequently formed. In the embodiment shown, the photoresist mask 507 is formed to the minimum size requirement of the selector element, since the selector element is over the memory element. In one embodiment, example minimum sizes for the resist could be in the range of 10 nm-100 nm.

Figure 5D:
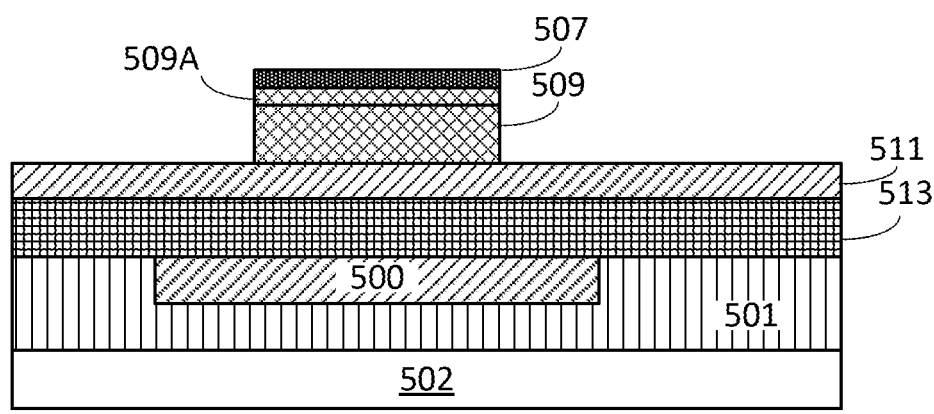

FIG. 5D illustrates the structure of FIG. 5C following the patterning of the selector material stack 509 in alignment with the photoresist mask 507. In an embodiment, a plasma etch process is utilized to pattern the selector material stack 509 down to the conductive electrode layer 511 to form a selector element 510.

Figure 5E:
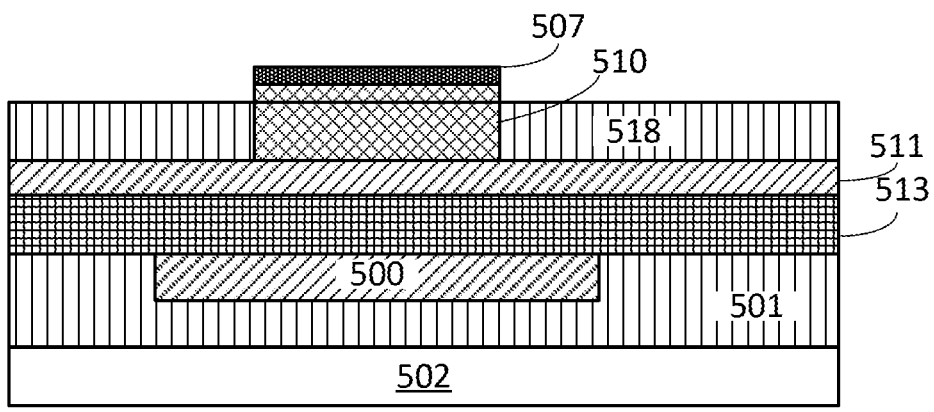

FIG. 5E illustrates the structure of FIG. 5D following the formation of a conformal film 518 on the conductive electrode layer 511, which will become a spacer around the selector element 510. The conformal film 518 may be deposited through thin film deposition, chemical vapor deposition (CVD), and ALD. Example non-conductive materials for the conformal film 518 may include silicon dioxide, silicon nitride, or some silicon dioxide base material like silicon oxi-nitride, aluminum oxide or any type of oxide. The thickness of the conformal film is less than the thickness of the selector material stack 509.

Figure 5F:
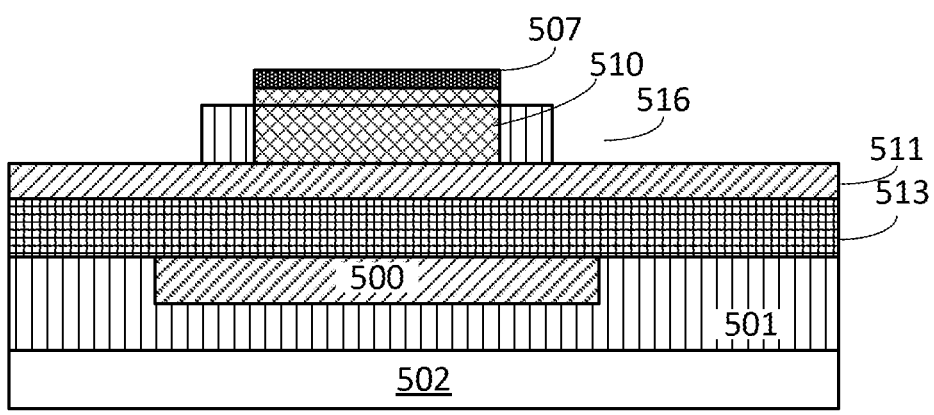

FIG. 5F illustrates the structure of FIG. 5E following the patterning of the conformal film 518 to a required size of the memory element via an etch process down to the conductive electrode layer 511 to form a spacer.

Figure 5G:
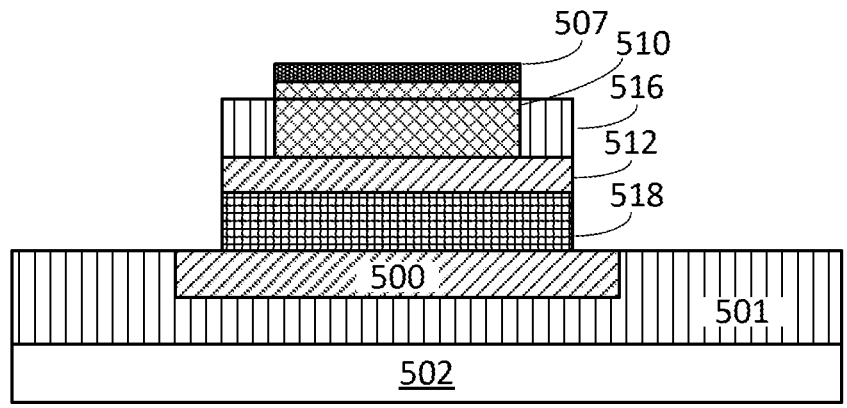

FIG. 5G illustrates the structure of FIG. 5F following the patterning the conductive electrode layer 511 and the memory material layer 513 via an etch process to form a conductive electrode 512 and a memory element 518 in alignment with the spacer 516. In an embodiment, a plasma etch process is utilized to pattern the memory material layer stack 513 and the conductive electrode layer 511.

Memory element 518, the conductive electrode 512, and the selector element 516 are herein referred to as an active memory device (as shown in FIGS. 2A-2B and 5G). In accordance with the embodiments disclosed herein, the selector element 510 and memory element 518 of the active memory device are sized independently of one another through a single lithography process.

According to one embodiment, the spacer 516 may be optionally removed at this point of the fabrication process depending on the application.

Figure 5H:
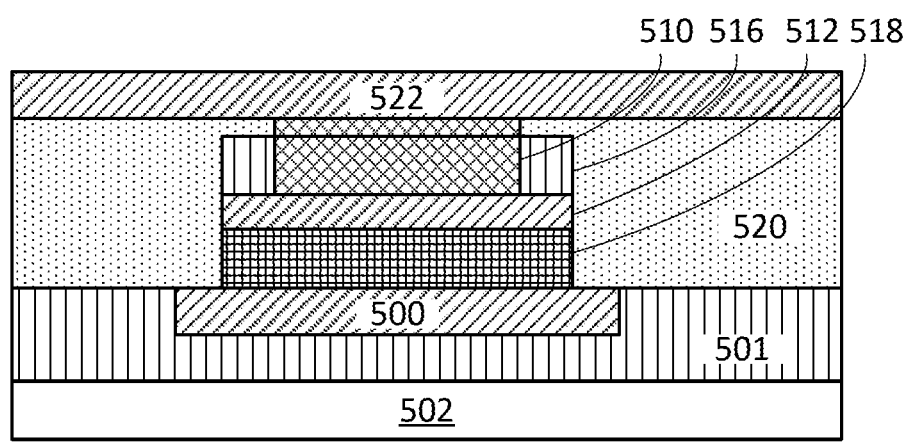
FIG. 5H illustrates the structure of FIG. 5G following deposition of a second dielectric layer and patterning of a bitline.

FIG. 5H illustrates the structure of FIG. 5G following deposition of a second dielectric layer and patterning of a bitline. The memory cell may be completed by removing the photoresist mask 507 and then forming a second dielectric layer 520 on the wordline 500 and on the dielectric layer 501 and on the active memory device (on the hardmask, on sidewalls of the selector element and on sidewalls of the memory element). The second dielectric letter 520 is planarized to expose an uppermost surface of the selector element 510. Thereafter, a bitline 522 is patterned on the uppermost surface of the selector element 510 and on the uppermost surface of the second dielectric layer 518 to complete formation of the memory cell. In an embodiment, the bitline 522 may comprise conductive material such as W, TiN, TaN or Ru. In an embodiment, the bitline 522 is formed by using a dual damascene process (not shown) and includes a barrier layer such as Ru, Ta or Ti and a fill metal such as W or Cu.

It is to be appreciated that the layers and materials described in association with embodiments herein are typically formed on or above an underlying semiconductor substrate, e.g., as FEOL layer(s). In other embodiments, the layers and materials described in association with embodiments herein are formed on or above underlying device layer(s) of an integrated circuit, e.g., as BEOL layer(s). In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers. For example, in one embodiment, an embedded non-volatile memory structure is formed on a material composed of a dielectric material such as, but not limited to, silicon dioxide, silicon oxy-nitride, silicon nitride, or carbon-doped silicon nitride. In a particular embodiment, an embedded non-volatile memory structure is formed on a low-k dielectric layer of an underlying BEOL layer.

In an embodiment, interconnect lines (and, possibly, underlying via structures) described herein are composed of one or more metal or metal-containing conductive structures. The conductive interconnect lines are also sometimes referred to in the art as traces, wires, lines, metal, interconnect lines or simply interconnects. In a particular embodiment, each of the interconnect lines includes a barrier layer and a conductive fill material. In an embodiment, the barrier layer is composed of a metal nitride material, such as tantalum nitride or titanium nitride. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

Interconnect lines described herein may be fabricated as a grating structure, where the term "grating" is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines spaced at a constant pitch and having a constant width. The pattern may be fabricated by a pitch halving or pitch quartering, or other pitch division, approach.

In an embodiment, ILD materials described herein are composed of or include a layer of a dielectric or insulating material. Examples of suitable dielectric materials include, but are not limited to, oxides of silicon (e.g., silicon dioxide (SiO2)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, patterning of trenches is achieved using lithographic operations performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

The integrated circuit structures described herein may be included in an electronic device. As an example of one such apparatus, FIGS. 6A and 6B are top views of a wafer and dies that include one or more embedded non-volatile memory structures having a bilayer selector, in accordance with one or more of the embodiments disclosed herein.

Figure 6B:
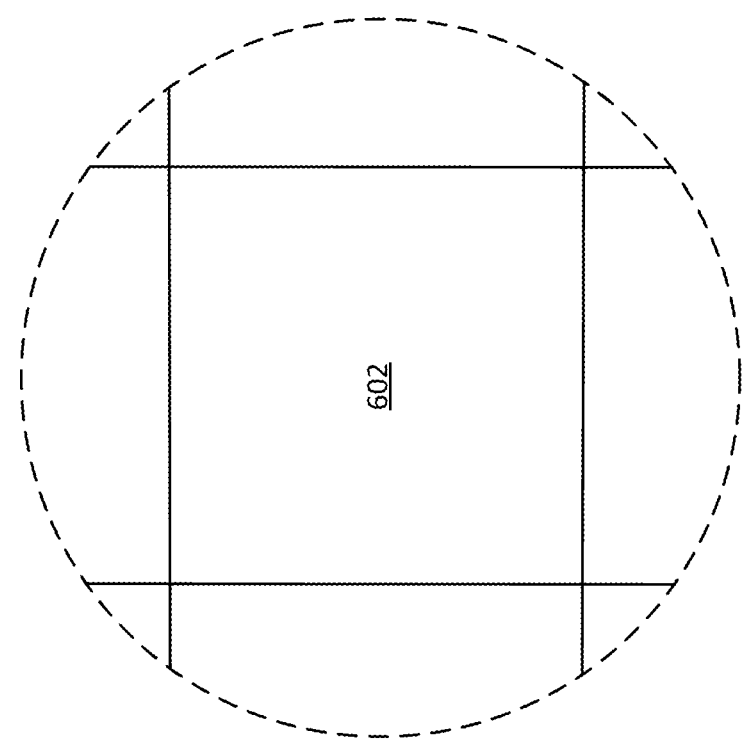
FIGS. 6A and 6B are top views of a wafer and dies that include one or more embedded non-volatile memory structures having a bilayer selector, in accordance with one or more of the embodiments disclosed herein.
Figure 6A:
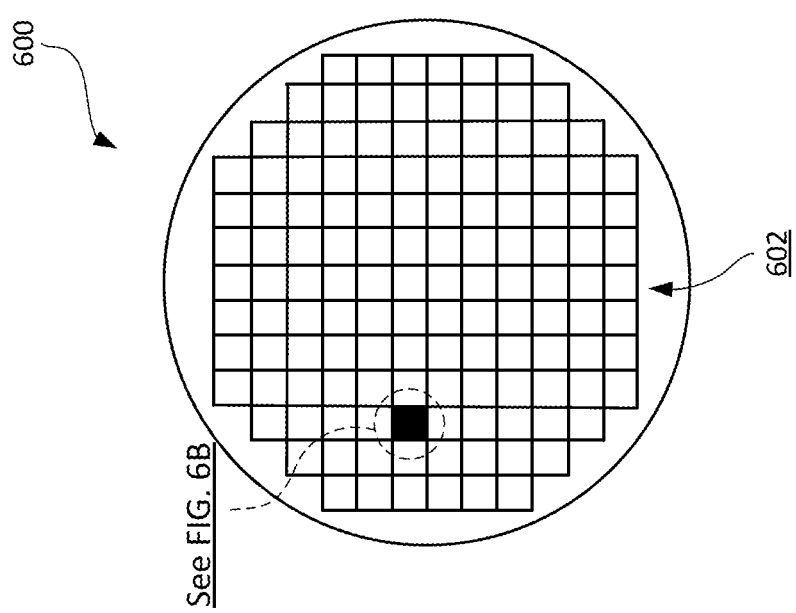

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more embedded non-volatile memory structures having a bilayer selector, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
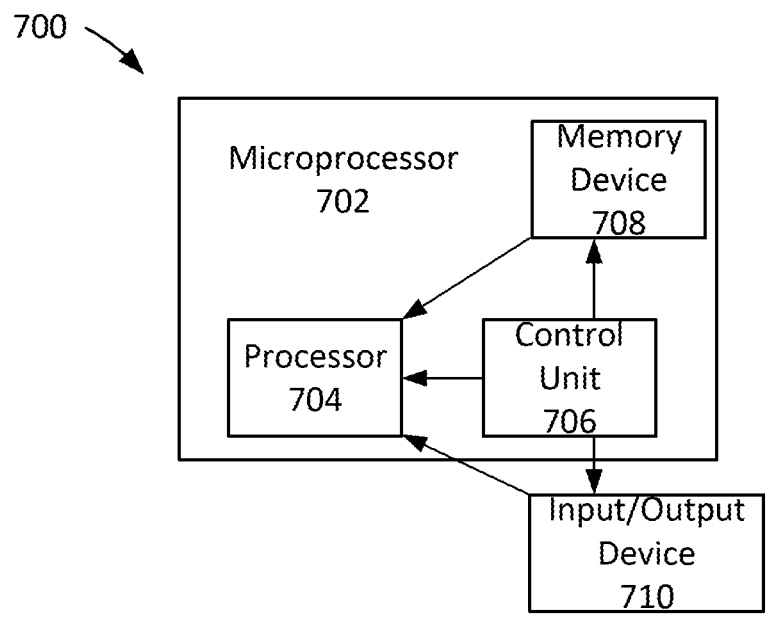
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more embedded non-volatile memory structures having a bilayer selector, such as those described herein.

Figure 8:
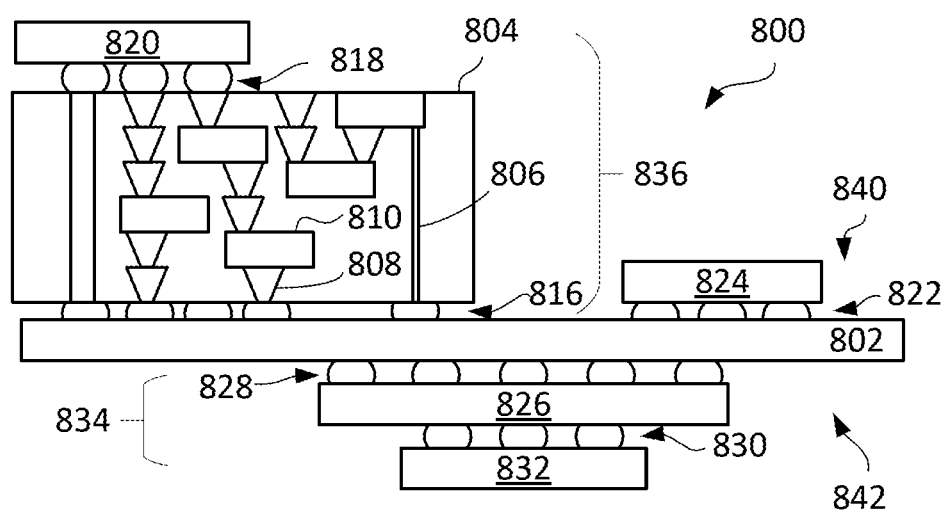
FIG. 8 is a cross-sectional side view of an integrated circuit (IC) device assembly that may include one or more embedded non-volatile memory structures having a bilayer selector, in accordance with one or more of the embodiments disclosed herein.

FIG. 8 is a cross-sectional side view of an integrated circuit (IC) device assembly that may include one or more embedded non-volatile memory structures having a bilayer selector, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of embedded non-volatile memory structures having a bilayer selector, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
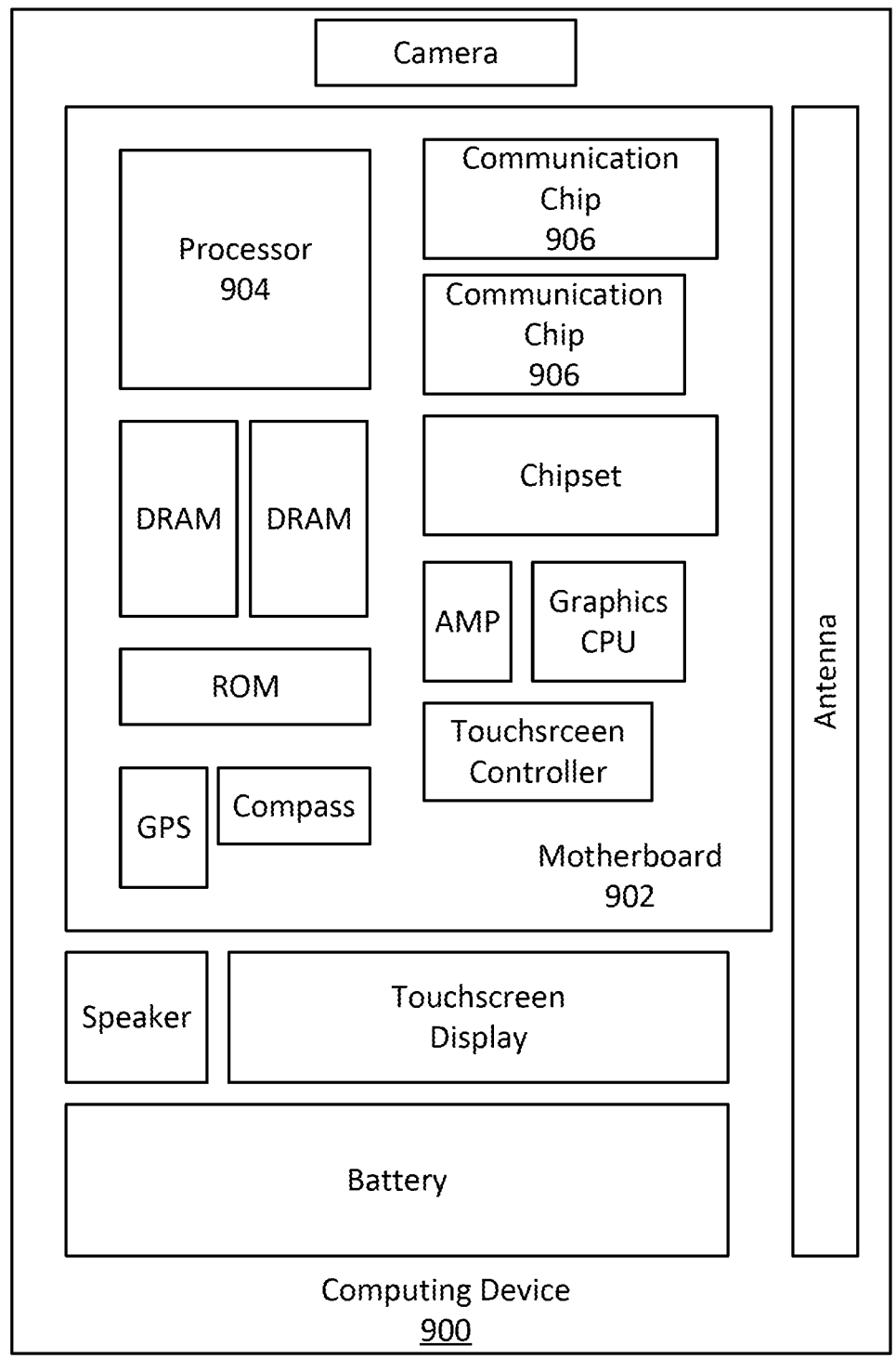
FIG. 9 illustrates a computing device in accordance with one implementation of an embodiment of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more embedded non-volatile memory structures having a bilayer selector, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more embedded non-volatile memory structures having a bilayer selector, in accordance with implementations of embodiments of the disclosure.

In further implementations, another component housed within the computing device 900 may contain an integrated circuit die that includes one or more embedded non-volatile memory structures having a bilayer selector, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include embedded non-volatile memory structures having bilayer selector elements.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

A memory device includes a metal layer. A selector element is above the metal layer. A memory element is above the metal line. A spacer surrounds one of the selector element and the memory element having a smallest width, and wherein the one of the selector element and the memory element not surrounded by the spacer has a width substantially identical to the spacer and is in alignment with the spacer.

Example Embodiment 2

The memory device of example embodiment 1, wherein the selector element is above the memory element.

Example Embodiment 3

The memory device of example embodiment 2, wherein the spacer surrounds the selector element and has a spacer width larger than a selector element width.

Example Embodiment 4

The memory device of example embodiment 2 or 3, wherein the selector element is smaller width-wise than the memory element.

Example Embodiment 5

The memory device of example embodiment 1, wherein the memory element is above the selector element.

Example Embodiment 6

The memory device of example embodiment 5, wherein the spacer surrounds the memory element and has a spacer width larger than a memory element width.

Example Embodiment 7

The memory device of example embodiment 5 or 6, wherein the memory element is smaller width-wise than the selector element.

Example Embodiment 8

The memory device of example embodiment 1, 2, 3, 4, 5, 6 or 7, wherein further comprising a conductive electrode between the selector element and the memory element.

Example Embodiment 9

The memory device of example embodiment 1, 2, 3, 4, 5, 6, 7, or 8 wherein the selector element comprises one of a monolayer selector element, a bilayer selector element, and a tri-layer selector element.

Example Embodiment 10

The memory device of example embodiment 1, 2, 3, 4, 5, 6, 7, 8 or 9, wherein the metal layer comprises a wordline.

Example Embodiment 11

The memory device of example embodiment 1, 2, 3, 4, 5, 6, 7, 8, 9, or 10, further comprising a bitline above the wordline.

Example Embodiment 12

The memory device of example embodiment 1, 2, 3, 4, 5, 6, 7, 8, 9, 10 or 11, wherein the memory element comprises a resistive random access memory (RRAM) device.

Example Embodiment 13

The memory device of example embodiment 1, 2, 3, 4, 5, 6, 7, 8, 9, 10, or 11, wherein the memory element comprises a magnetic tunnel junction (MTJ) device.

Example Embodiment 14

The memory device of example embodiment 1, 2, 3, 4, 5, 6, 7, 8, 9, 10, or 11, wherein the memory element comprises a phase change memory (PCM) device.

Example Embodiment 15

A memory structure includes a first bitline, a top element below the bitline, the top element comprising one of a selector element and a memory element, the top element having a top element width and a top element thickness. A spacer surrounds the top element, the spacer having a spacer width larger than the top element width and a thickness less than the top element. A bottom element below the spacer and the top element, the bottom element comprising one of the selector element and the memory element not present in the top element, the bottom element in alignment with both the top element and the spacer and having a bottom element width substantially identical to the spacer. A wordline is below the bottom element.

Example Embodiment 16

The memory structure of example embodiment 15, wherein the selector element is above the memory element.

Example Embodiment 17

The memory structure of example embodiment 16, wherein the spacer surrounds the selector element and has a spacer width larger than a selector element width.

Example Embodiment 18

The memory structure of example embodiment 16 or 17, wherein the selector element is smaller width-wise than the memory element.

Example Embodiment 19

The memory structure of example embodiment 15, wherein the memory element is above the selector element.

Example Embodiment 20

The memory structure of example embodiment 19, wherein the spacer surrounds the memory element and has a spacer width larger than a memory element width.

Example Embodiment 21

The memory structure of example embodiment 19 or 20, wherein the memory element is smaller width-wise than the selector element.

Example Embodiment 22

The memory structure of example embodiment 15, 16, 17, 18, 19, 20, or 21, further comprising a conductive electrode between the selector element and the memory element.

Example Embodiment 23

The memory structure of example embodiment 15, 16, 17, 18, 19, 20, 21, or 22, wherein the selector element comprises one of a monolayer selector element, a bilayer selector element, and a tri-layer selector element.

Example Embodiment 24

A method of fabricating a memory device includes forming a wordline in a first dielectric layer above a substrate; forming a memory material layer stack above the wordline; forming a conductive electrode layer above the memory material layer stack; forming a selector material stack on the conductive electrode layer; forming a hardmask layer above the selector material stack; forming a photoresist mask on the hardmask layer above the selector material stack, the photoresist mask formed at a minimum size required for a selector element; patterning the selector material stack in alignment with the photoresist mask down to the conductive electrode layer to form the selector element; forming a conformal film on the conductive electrode layer; patterning the conductive electrode layer to form a conductive electrode; patterning the conformal film down to the conductive electrode layer to a size required for a memory element; patterning the conductive electrode layer and the memory material layer to form a conductive electrode and the memory element in alignment with the spacer; forming a second dielectric layer on the wordline, on the hardmask, on sidewalls of the selector element and on sidewalls of the memory element; planarizing the second dielectric layer to expose an uppermost surface of the selector element; and forming a bitline on the uppermost surface of the selector memory element and on an uppermost surface of the second dielectric layer. Example embodiment 25: The memory structure of example embodiment 24 further comprising forming the metal layer as a wordline.

What is claimed is:

1. A memory device, comprising:
a metal layer;
a selector element above the metal layer;
a memory element above the metal layer;
a spacer surrounding one of the selector element and the memory element having a smallest width, the spacer having a thickness less than the surrounded one of the selector element and the memory element, and wherein the one of the selector element and the memory element not surrounded by the spacer has a width substantially identical to the spacer and is in alignment with the spacer.

2. The memory device of claim 1, wherein the selector element is above the memory element.

3. The memory device of claim 2, wherein the spacer surrounds the selector element and has a spacer width larger than a selector element width.

4. The memory device of claim 2, wherein the selector element is smaller width-wise than the memory element.

5. The memory device of claim 1, wherein the memory element is above the selector element.

6. The memory device of claim 5, wherein the spacer surrounds the memory element and has a spacer width larger than a memory element width.

7. The memory device of claim 5, wherein the memory element is smaller width-wise than the selector element.

8. The memory device of claim 1, further comprising a conductive electrode between the selector element and the memory element.

9. The memory device of claim 1, wherein the selector element comprises one of a monolayer selector element, a bilayer selector element, and a tri-layer selector element.

10. The memory device of claim 1, wherein the metal layer comprises a wordline.

11. The memory device of claim 1, further comprising a bitline above the wordline.

12. The memory device of claim 1, wherein the memory element comprises a resistive random access memory (RRAM) device.

13. The memory device of claim 1, wherein the memory element comprises a magnetic tunnel junction (MTJ) device.

14. The memory device of claim 1, wherein the memory element comprises a phase change memory (PCM) device.

15. A memory structure, comprising:
a bitline;
a top element below the bitline, the top element comprising one of a selector element and a memory element, the top element having a top element width and a top element thickness;
a spacer surrounding the top element, the spacer having a spacer width larger than the top element width and a thickness less than the top element;
a bottom element below the spacer and the top element, the bottom element comprising one of the selector element and the memory element not present in the top element, the bottom element in alignment with both the top element and the spacer and having a bottom element width substantially identical to the spacer; and
a wordline below the bottom element.

16. The memory structure of claim 15, wherein the selector element is above the memory element.

17. The memory structure of claim 16, wherein the spacer surrounds the selector element and has a spacer width larger than a selector element width.

18. The memory structure of claim 16, wherein the selector element is smaller width-wise than the memory element.

19. The memory structure of claim 15, wherein the memory element is above the selector element.

20. The memory structure of claim 19, wherein the spacer surrounds the memory element and has a spacer width larger than a memory element width.

21. The memory structure of claim 19, wherein the memory element is smaller width-wise than the selector element.

22. The memory structure of claim 15, wherein further comprising a conductive electrode between the selector element and the memory element.

23. The memory structure of claim 15, wherein the selector element comprises one of a monolayer selector element, a bilayer selector element, and a tri-layer selector element.

* * * * *